(12) United States Patent
Potter et al.

(10) Patent No.: US 10,847,393 B2
(45) Date of Patent: Nov. 24, 2020

(54) METHOD AND APPARATUS FOR MEASURING PROCESS KIT CENTERING

(71) Applicant: APPLIED MATERIALS, INC., Santa Clara, CA (US)

(72) Inventors: Charles G. Potter, Santa Clara, CA (US); Eli Mor, Garden City, ID (US)

(73) Assignee: Applied Materials, Inc., Santa Clara, CA (US)

( * ) Notice: Subject to any disclaimer, the term of this patent is extended or adjusted under 35 U.S.C. 154(b) by 74 days.

(21) Appl. No.: 16/121,183

(22) Filed: Sep. 4, 2018

(65) Prior Publication Data
US 2020/0075368 A1    Mar. 5, 2020

(51) Int. Cl.
| | |
|---|---|
| *G01R 27/26* | (2006.01) |
| *H01L 21/67* | (2006.01) |
| *G01B 7/14* | (2006.01) |
| *G01B 7/00* | (2006.01) |
| *G01B 7/06* | (2006.01) |
| *G01B 7/02* | (2006.01) |

(52) U.S. Cl.
CPC ........ *H01L 21/67259* (2013.01); *G01B 7/003* (2013.01); *G01B 7/023* (2013.01); *G01B 7/08* (2013.01); *G01B 7/087* (2013.01); *G01B 7/14* (2013.01); *B65H 2220/03* (2013.01); *B65H 2511/13* (2013.01); *B65H 2511/162* (2013.01); *B65H 2515/712* (2013.01)

(58) Field of Classification Search
CPC ............ B65H 2220/03; B65H 2511/13; B65H 2511/162; B65H 2515/712; G01B 7/003; G01B 7/08; G01B 7/023; G01B 7/087

USPC .......... 324/76.11–76.83, 459, 600, 635, 644, 324/649, 658, 662, 663, 671, 716
See application file for complete search history.

(56) References Cited

U.S. PATENT DOCUMENTS

| | | | |
|---|---|---|---|
| 6,499,367 B1 | 12/2002 | Saeki | |
| 7,778,793 B2 | 8/2010 | Bonciolini et al. | |
| 7,804,306 B2 | 9/2010 | Gardner et al. | |
| 9,903,739 B2 | 2/2018 | Sugita et al. | |
| 2003/0227624 A1* | 12/2003 | Wu ........................ | G03F 7/7075 356/400 |

(Continued)

FOREIGN PATENT DOCUMENTS

| | | |
|---|---|---|
| EP | 1669808 A2 | 6/2007 |
| JP | 4956328 B2 | 6/2012 |

(Continued)

OTHER PUBLICATIONS

International Search Report and Written Opinion from PCT/US2019/044755 dated Nov. 20, 2019, 13 pgs.

(Continued)

*Primary Examiner* — Raul J Rios Russo
(74) *Attorney, Agent, or Firm* — Schwabe, Williamson & Wyatt, P.C.

(57) ABSTRACT

Embodiments disclosed herein include a sensor wafer. In an embodiment, the sensor wafer comprises a substrate, wherein the substrate comprises a first surface, a second surface opposite the first surface, and an edge surface between the first surface and the second surface. In an embodiment, the sensor wafer further comprises a plurality of sensor regions formed along the edge surface, wherein each sensor region comprises a self-referencing capacitive sensor.

18 Claims, 10 Drawing Sheets

(56) References Cited

U.S. PATENT DOCUMENTS

| | | |
|---|---|---|
| 2007/0046284 A1 | 3/2007 | Renken et al. |
| 2007/0222462 A1 | 9/2007 | Gardner et al. |
| 2008/0231291 A1 | 9/2008 | Ramsey et al. |
| 2008/0246493 A1 | 10/2008 | Gardner |
| 2009/0001616 A1* | 1/2009 | Bonora ............ H01L 21/67282 257/797 |
| 2011/0074341 A1 | 3/2011 | Jensen et al. |
| 2011/0193573 A1 | 8/2011 | De Boer et al. |
| 2012/0304928 A1 | 12/2012 | Koelmel et al. |
| 2013/0029433 A1 | 1/2013 | Sun et al. |
| 2014/0262026 A1* | 9/2014 | Forster ............. H01J 37/32642 156/345.3 |
| 2015/0369583 A1* | 12/2015 | Potter, Sr. ......... H01L 21/67259 702/150 |
| 2016/0141154 A1 | 5/2016 | Kamata et al. |
| 2016/0211166 A1 | 7/2016 | Yan et al. |
| 2016/0220172 A1 | 8/2016 | Sarrafzadeh et al. |
| 2016/0363433 A1 | 12/2016 | Sugita et al. |
| 2017/0131217 A1 | 5/2017 | Tedeschi et al. |
| 2018/0114681 A1 | 4/2018 | Jensen et al. |
| 2018/0240694 A1 | 8/2018 | Adderly et al. |
| 2020/0075370 A1* | 3/2020 | Potter ................... B25J 9/1692 |

FOREIGN PATENT DOCUMENTS

| | | |
|---|---|---|
| JP | 2017003557 A | 1/2017 |
| JP | 2017-228754 | 12/2017 |
| KR | 1020170014384 A | 2/2017 |
| KR | 101841607 B1 | 3/2018 |

OTHER PUBLICATIONS

International Search Report and Written Opinion from PCT/US2019/047535 dated Dec. 10, 2019, 10 pgs.
International Search Report and Written Opinion from PCT/US2019/047752 dated Dec. 10, 2019, 12 pgs.
International Search Report and Written Opinion from PCT/US2019/047983 dated Dec. 13, 2019, 12 pgs.
International Search Report and the Written Opinion from PCT/US2019/044524 dated Dec. 20, 2019, 10 pgs.

* cited by examiner

METHOD AND APPARATUS FOR MEASURING PROCESS KIT CENTERING

BACKGROUND

1) Field

Embodiments relate to the field of semiconductor manufacturing and, in particular, to methods and apparatuses for measuring process kit centering.

2) Description of Related Art

In the processing of substrates, such as semiconducting wafers, a substrate is placed on a support surface (e.g., an electrostatic chuck (ESC)) in a processing chamber. Typically, a process kit is placed around the support surface to provide desired processing characteristics during substrate processing. Process kits loosely fit around the support surface so that neither the support surface nor the process kit is damaged during installation or removal of the process kit. In order to provide the desired uniformity, the process kit needs to be accurately centered with respect to the substrate and the support surface.

Currently, process kits are installed manually. As such, the centering of the process kit is currently subject to human error. After manual installation, various tests, such as etch rate tests or particle tests may be implemented to confirm the process kit is adequately centered. However, such test are expensive and can take hours to complete. Furthermore, if the process kit is found to be off-center, the time to recover is significantly longer than if the centering can be verified right after pump-down.

SUMMARY

Embodiments disclosed herein include a sensor wafer. In an embodiment, the sensor wafer comprises a substrate, wherein the substrate comprises a first surface, a second surface opposite the first surface, and an edge surface between the first surface and the second surface. In an embodiment, the sensor wafer further comprises a plurality of sensor regions formed along the edge surface, wherein each sensor region comprises a self-referencing capacitive sensor.

Embodiments disclosed herein may also include a method of determining the position of a process kit in a chamber. In an embodiment, the method comprises, placing a process kit into a chamber around a support surface. In an embodiment, the method may further comprise placing a sensor wafer onto the support surface, wherein the sensor wafer comprises a first surface that is supported by the support surface, a second surface opposite the first surface, and an edge surface connecting the first surface to the second surface, and wherein a plurality of sensor regions are formed on the edge surface. In an embodiment, the method may further comprise determining a gap distance between each of the plurality of sensor regions and a surface of the process kit. In an embodiment, the method may further comprise determining a center-point offset of a center-point of the process kit relative to a center-point of the sensor wafer from the gap distances.

Embodiments disclosed herein may also include a method of determining the position of a process kit in a chamber. In an embodiment, the method comprises placing a process kit into a chamber around a support surface. In an embodiment, the method further comprises placing a sensor wafer onto the support surface, wherein the sensor wafer comprises a first surface that is supported by the support surface, a second surface opposite the first surface, and an edge surface connecting the first surface to the second surface, and wherein a first plurality of sensor regions are formed on the edge surface and a second plurality of sensor regions are formed on the first surface. In an embodiment, the method further comprises determining a gap distance between each of the plurality of first sensor regions and a surface of the process kit. In an embodiment, the method further comprises determining a first center-point offset from the gap distances, wherein the first center-point offset is an offset of a center-point of the process kit relative to a center-point of the sensor wafer. In an embodiment, the method further comprises determining a plurality of edge locations of the support surface with the plurality of second sensor regions. In an embodiment, the method further comprises determining a second center-point offset with the plurality of edge locations, wherein the second center-point offset is an offset of a center-point of the support surface relative to the center-point of the sensor wafer.

DETAILED DESCRIPTION

Systems that include sensor wafers with edge sensors and methods of using such sensor wafers to measure process kit centering are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, process kits are currently installed and centered in a processing tool manually. In order to confirm that the process kit is properly centered, a plurality of substrates are processed in the processing tool to monitor etch rates and/or to run particle tests. Only after many substrates are processed will it be possible to confirm that the process kit is properly centered. This process requires hours of down time for the processing tool and is expensive.

Accordingly, embodiments disclosed herein include a sensor wafer that is capable of measuring the offset of the process kit directly. As such, a single test procedure may be implemented after pump-down of the processing tool in order to confirm that the process kit is centered within a desired tolerance. If the process kit placement is found to be outside of the desired tolerance, then the process kit may be adjusted without the need for extensive testing. Therefore, embodiments disclosed herein provide reduced down time of processing tools and improves the uniformity of processes implemented by the processing tool since the centering tolerance of the process kit can be improved.

Figure 1:
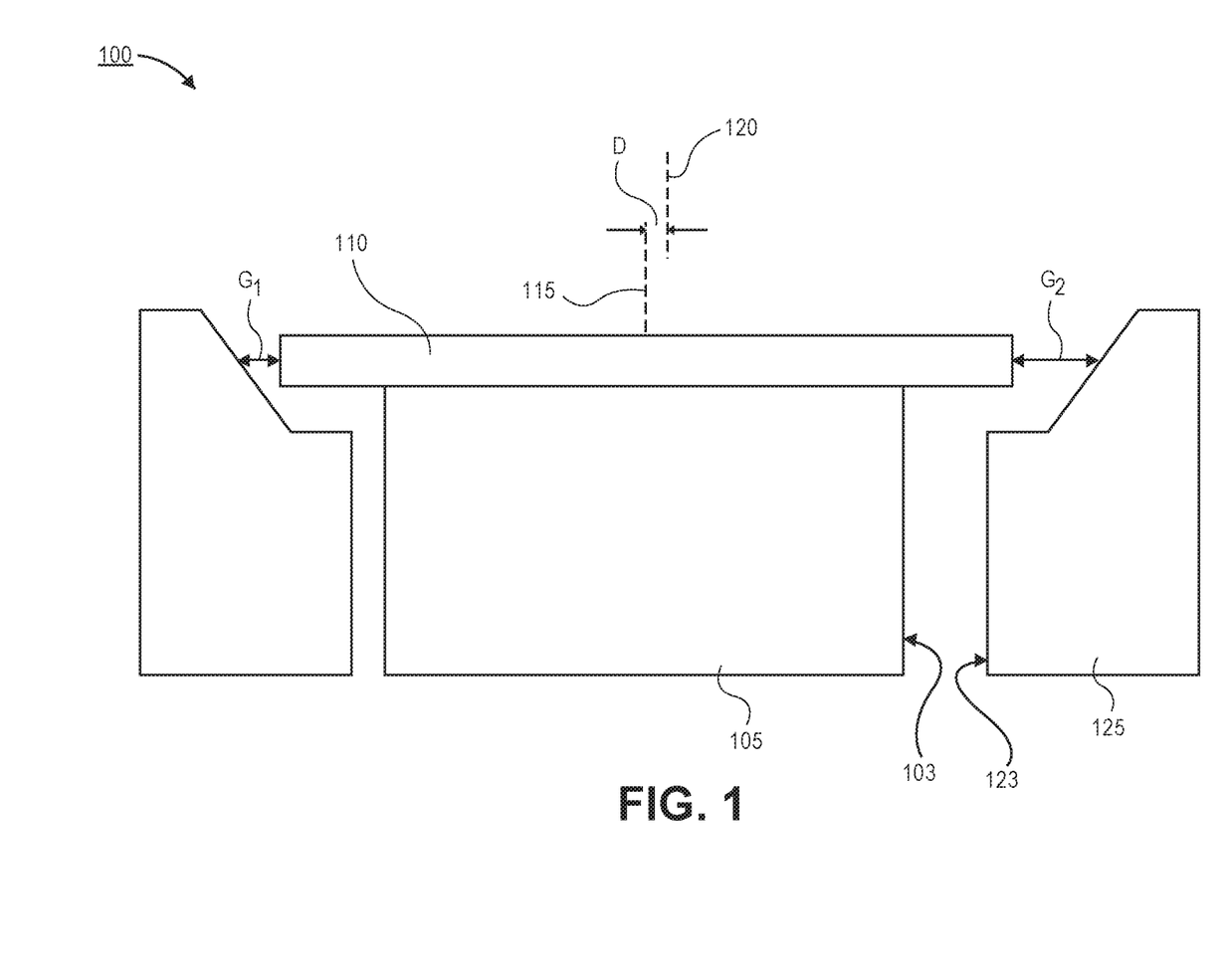
FIG. 1 is a cross-sectional schematic illustration of a processing tool with a sensor wafer for measuring the offset of a process kit, in accordance with an embodiment.

Referring now to FIG. 1, a schematic cross-sectional illustration of a processing tool 100 is shown, in accordance with an embodiment. In an embodiment, the processing tool 100 may comprise a support surface 105 for supporting substrates processed in the processing tool 100. The support surface 105 may be any suitable support surface 105, such as an electrostatic chuck (ESC), or the like. In an embodiment, a process kit 125 may be positioned around the support surface 105. For example, the process kit 125 may be a ring that entirely surrounds the support surface 125.

The process kit 125 may loosely fit around the support surface 105. As shown, an innermost surface 123 of the process kit 125 may have a diameter that is larger than a diameter of an outermost surface 103 of the support surface 105. Since surface 103 and surface 123 are not in direct contact with each other, there is room for the process kit 125 to be off-center from the support surface 105.

Figure 5:
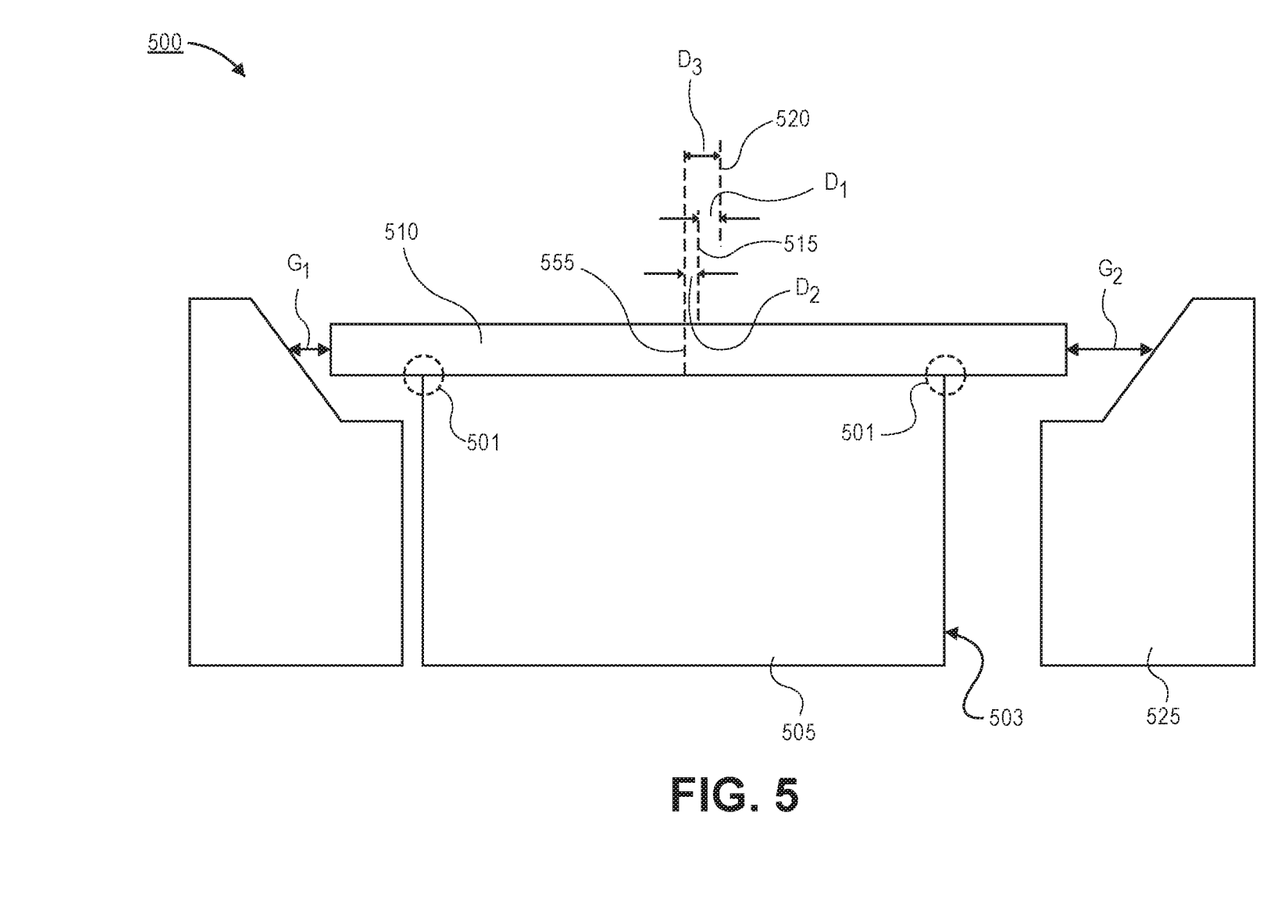
FIG. 5 is a cross-sectional schematic illustration of a processing tool with a sensor wafer for measuring the offset of a process kit relative to a center of a support surface, in accordance with an embodiment.

As shown in FIG. 1, a sensor wafer 110 may be used to measure whether the process kit 125 is off-center. In an embodiment, the sensor wafer 110 may have substantially the same dimensions as a production wafer. For example, the sensor wafer 110 may have a diameter that is a standard wafer diameter (e.g., 300 mm or the like). In FIG. 1, the sensor wafer 110 has an edge that is non-uniformly spaced with respect to the process kit 125. For example, a gap $G_1$ on the left side of FIG. 1 is smaller than a gap $G_2$ on the right side of FIG. 1. The non-uniform gaps $G_1$ and $G_2$ result in the center line 120 of the process kit 125 being offset a distance D from the center line 115 of the sensor wafer 110. In FIG. 1, the center line 115 of the sensor wafer is aligned with the center of the support surface 105, however embodiments are not limited to such configurations. FIG. 5 described below describes situations where the center line 115 of the sensor wafer is not aligned with the center of support surface 105.

In an embodiment, the offset distance D may be determined by measuring the gap G between the edge of the sensor wafer 110 and a surface of the process kit 125 in a plurality of locations. In a particular embodiment, the gap G is measured with a plurality of sensor regions formed on the edges of the sensor wafer 110. FIGS. 2-4C provide exemplary illustrations of sensor wafers 110 with edge sensor regions, in accordance with various embodiments.

Figure 2:
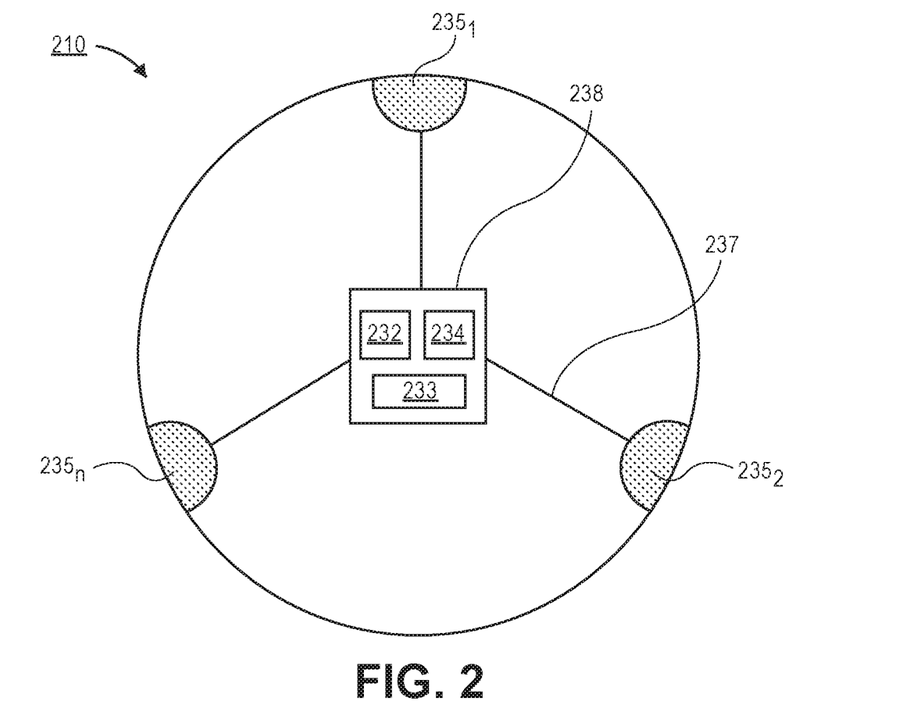
FIG. 2 is a plan view illustration of a sensor wafer with edge sensors, in accordance with an embodiment.

Referring now to FIG. 2, a plan view illustration of a sensor wafer 210 with a plurality of edge sensor regions $235_1$-$235_n$ is shown, in accordance with an embodiment. In an embodiment, the edge sensor regions 235 are distributed around the perimeter of the sensor wafer 210. Each sensor region 235 comprises one or more sensors that are used to measure the gap between the edge of the sensor wafer 210 and the process kit (not shown) that encircles the sensor wafer 210. The one or more sensors in the edge sensor regions 235 may be capacitive sensors. In a particular embodiment, the edge sensor regions 235 may comprise self-referencing capacitive sensors.

In the illustrated embodiment, three edge sensor regions 235 are shown. However, it is to be appreciated that three or more edge sensor regions 235 may be used to measure the offset of the center of the process kit relative to the center of the sensor wafer 210. Those skilled in the art will recognize that providing more edge sensor regions 235 will provide more accurate measurements.

In an embodiment, each of the edge sensor regions 235 may be communicatively coupled to a computing module 238 on the sensor wafer 210 with traces 237. In an embodiment, the computing module 238 may comprise one or more of a power source 232 (e.g., a battery), a processor/memory 234 (e.g., circuitry, memory, etc. for implementing and/or storing measurements made with the edge sensor regions 235), and a wireless communication module 233 (e.g., Bluetooth, WiFi, etc.). In an embodiment, computing module 238 may be embedded in the sensor wafer 210. Additionally, while shown in the center of the sensor wafer 210, it is to be appreciated that the computing module 238 may be located at any convenient location in the sensor wafer 210.

Figure 3:
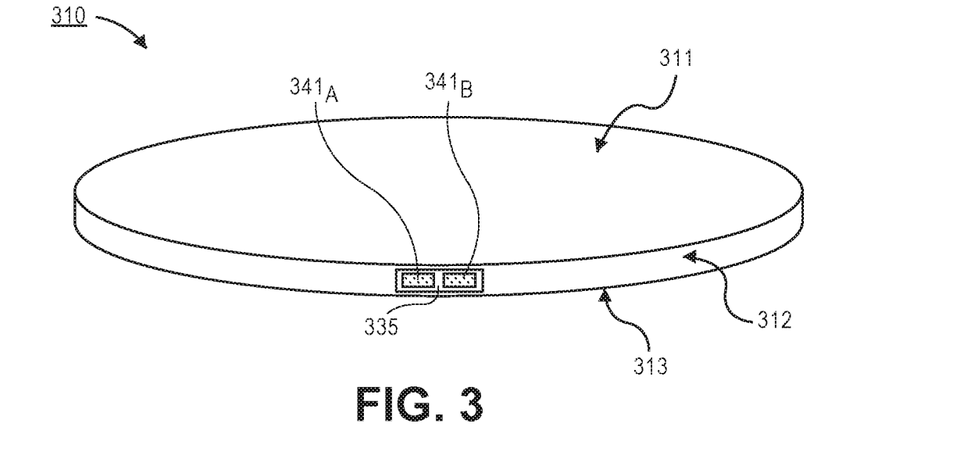
FIG. 3 is a perspective view illustration of a sensor wafer with edge sensors, in accordance with an embodiment.

Referring now to FIG. 3, a perspective view illustration of a sensor wafer 310 that highlights the details of an exemplary edge sensor region 335 is shown, in accordance with an embodiment. In an embodiment, the sensor wafer 310 may comprise a first surface 311 (e.g., a top surface), a second surface 313 (e.g., a bottom surface), and an edge surface 312 that connects the first surface 311 to the second surface 313. In an embodiment, the edge sensor region 335 may be formed along the edge surface 312.

In a particular embodiment, the edge sensor region 335 may comprise a probe 341. The probes 341 (i.e., the probe in each edge sensor region) may be a self-referencing capacitive probes. That is, an output phase of current supplied to a first probe 341 in a first edge sensor region 335 may be 180 degrees offset from an output phase of current supplied to a second probe 341 in a neighboring second edge sensor region 335. As such, a distance measurement from the edge surface 312 to the surface of the process kit (not shown) may be made without the process kit needing to be grounded. In the illustrated embodiment, the edge sensor region 335 is shown as having a single probe. However, in some embodiments, each edge sensor region 335 may comprise more than one probe 341. While particular reference is made herein to self-referencing capacitive sensors, it is to be appreciated that embodiments disclosed herein include any suitable sensor technology (e.g., laser sensors, optical sensors, etc.).

Figure 4A:
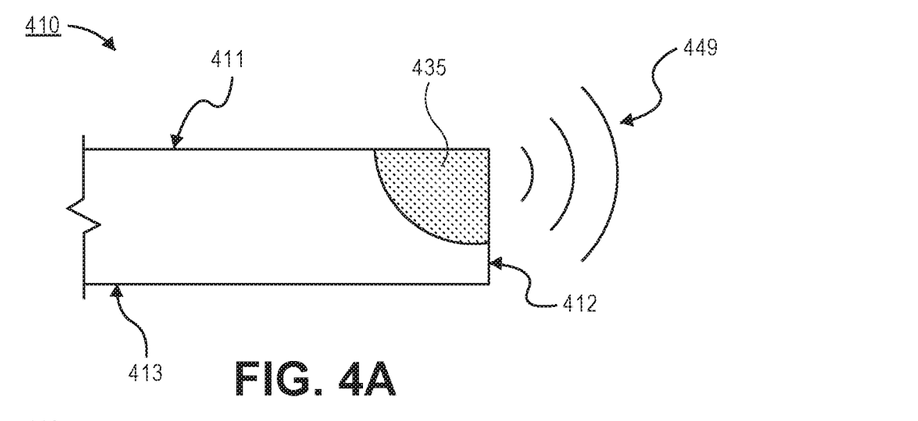
FIG. 4A is a partial cross-sectional illustration of a sensor wafer with an edge sensor, in accordance with an embodiment.
Figure 4B:
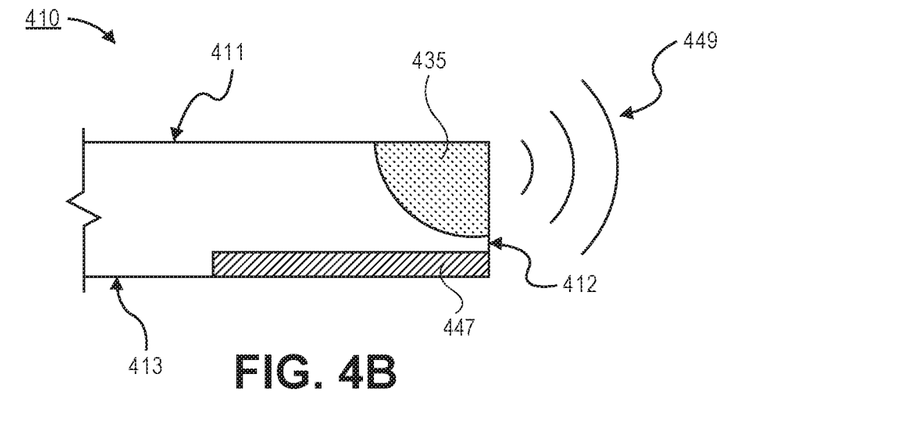
FIG. 4B is a partial cross-sectional illustration of a sensor wafer with an edge sensor and an electric field guard, in accordance with an embodiment.
Figure 4C:
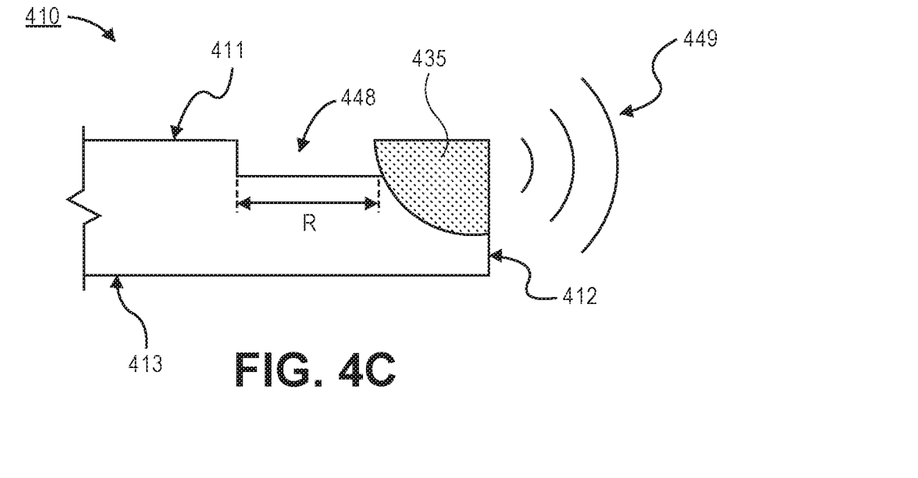
FIG. 4C is a partial cross-sectional illustration of a sensor wafer with an edge sensor and a top surface recess, in accordance with an embodiment.

Referring now to FIGS. 4A-4C, exemplary partial cross-sectional illustrations of sensor wafers 410 are shown, in accordance with various embodiments. In FIG. 4A, a partial cross-sectional illustration depicts the sensor region 435 being substantially coplanar with the edge surface 412. In an embodiment, the sensor region 435 emits an electric field 449 from the edge surface 412 so that the sensors may measure a gap between the edge surface 412 and a surface of the process kit.

Referring now to FIG. 4B, a partial cross-sectional illustration of a sensor wafer 410 with a an electric field guard 447 is shown, in accordance with an embodiment. In an embodiment, the electric field guard 447 may be a conductive layer that is formed between a bottom surface 413 of the sensor wafer 410 and the edge sensor region 435. The electric field 449 of the edge sensor region 435 may be modified by the electric field guard 447. Particularly, the electric field guard 447 may modify the electric field 449 of the edge sensor region 435 so that it extends laterally out from the edge surface 412 towards the process kit. Accordingly, the electric field guard 447 prevents the sensors in the edge sensor region 435 from detecting objects below the sensor wafer 410 that may provide erroneous readings.

Referring now to FIG. 4C, a partial cross-sectional illustration of a sensor wafer 410 with a top surface recess 448 is shown, in accordance with an embodiment. In an embodiment, the top surface recess 448 may be formed into the first surface 411 immediately adjacent to the sensor region 435. The top surface recess 448 may be made to prevent the sensors of the sensor region 435 from sensing the top surface 411 and providing erroneous readings. In an embodiment, the top surface recess 448 may extend back a distance R. For example the distance R may be approximately equal to a maximum sensing distance of the edge sensing region 435. For example, the distance R may be 2.0 mm or less.

Referring now to FIG. 5, a cross-sectional schematic illustration of a processing tool 500 is shown, in accordance with an embodiment. The processing tool 500 may be substantially similar to the processing tool 100 described above with respect to FIG. 1, with the exception that the sensor wafer 510 provides the ability to determine an offset of the process kit 525 center-point 520 relative to a center-point 555 of the support surface 505.

In such an embodiment, the sensor wafer 510 may be used to measure a first offset $D_1$ and a second offset $D_2$. The first offset $D_1$ is the offset of the centerline 515 of the sensor wafer 510 relative to the centerline 520 of the process kit 525. The first offset $D_1$ may be determined by measuring gaps (e.g., $G_1/G_2$) between the edge of the sensor wafer 510 and a surface of the process kit 525 with edge sensors. The second offset $D_2$ is the offset of the center line 515 of sensor wafer 510 relative to the centerline 555 of the support surface 505. The second offset $D_2$ may be determined by detecting edge locations 501 of the edge surface 503 of the support surface 505 with bottoms facing sensors. In an embodiment, the offsets $D_1$ and $D_2$ may be added together to calculate a total offset $D_3$ of the centerline of the process kit 525 relative to the centerline of the support surface 505.

Figure 6A:
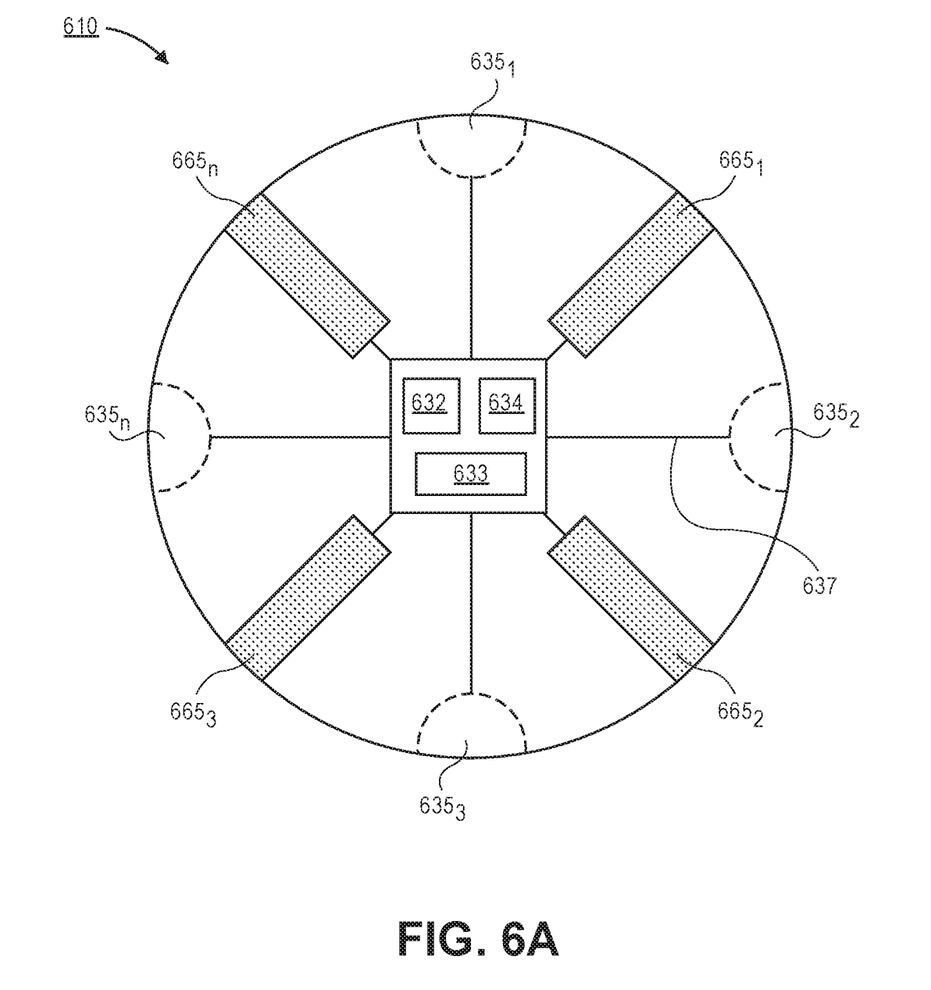
FIG. 6A is a plan view illustration of a bottom surface of a sensor wafer with sensor regions for measuring the position of the censor wafer relative to a center of a support surface and edge sensor regions for measuring the position of a process kit, in accordance with an embodiment.

Referring now to FIG. 6A, a plan view illustration of a bottom surface of the sensor wafer 610 with edge sensor regions $635_1$-$635_n$ and bottom sensor regions $665_1$-$665_n$ is shown, in accordance with an embodiment. Similar to the sensor wafer 210, sensor wafer 610 may comprise a computing module 638 that houses one or more of a power supply 632, a processor/memory 638, and a wireless communication module 633. The computing module 638 may be communicatively coupled to the edge sensor regions 635 and the bottom sensor regions 665 by conductive traces 637.

In an embodiment, the edge sensor regions $635_1$-$635_n$ may be substantially similar to the edge sensor regions 235 described above. In an embodiment, the bottom sensor regions $665_{1-n}$ may each comprise a plurality of sensors (e.g., capacitive sensors) that are configured to detect the edge of the support surface. By locating the edge of the support surface at a plurality of locations (e.g., three or more locations) with respect to the sensor wafer 610, the center-point of the support surface relative to the center-point of the sensor wafer 610 may be determined.

Figure 6B:
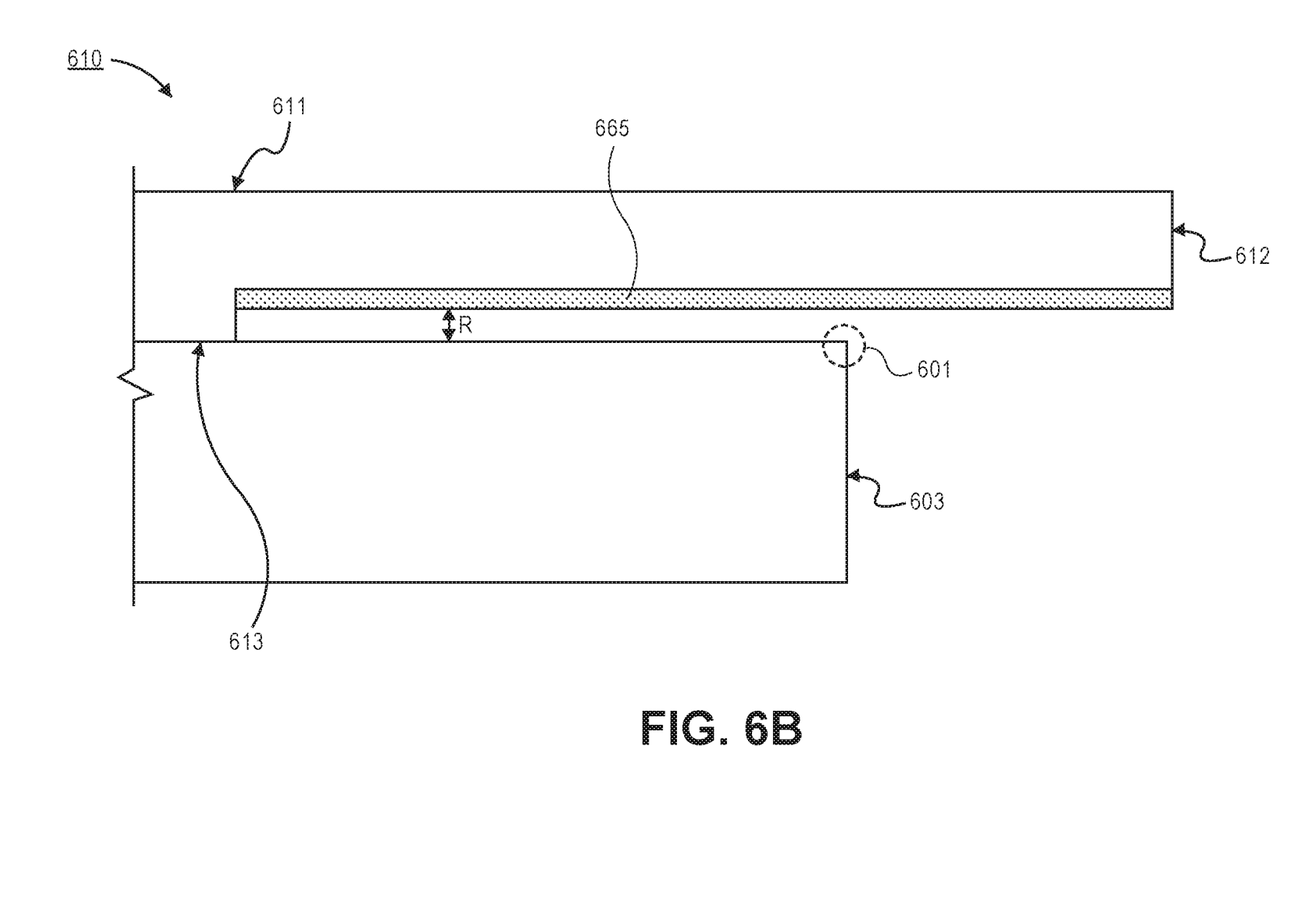
FIG. 6B is a partial cross-sectional illustration of a sensor wafer with a bottom sensor region, in accordance with an embodiment.

Referring now to FIG. 6B, a partial cross-sectional illustration of a sensor wafer 610 and a portion of the support surface 605 is shown, in accordance with an embodiment. As shown, the bottom sensor region 665 may be formed on a recessed portion of the second surface 613 that faces the support surface 605. In an embodiment, the bottom sensor region 665 may comprise an array of sensors (e.g., position sensors) that determine the spacing between the support surface 605 and the sensor region 665. Accordingly, at location 601, the array of sensors in the bottom sensor region 665 will indicate that the edge 603 of the support surface is present since there is no underlying surface detectable by the sensor region 665. The position of location 601 is known with respect to the center of the sensor wafer 610. As such, when three or more locations 601 are determined, a center-point of the support surface 605 relative to the center-point of the sensor wafer 610 can be calculated.

Figure 7:
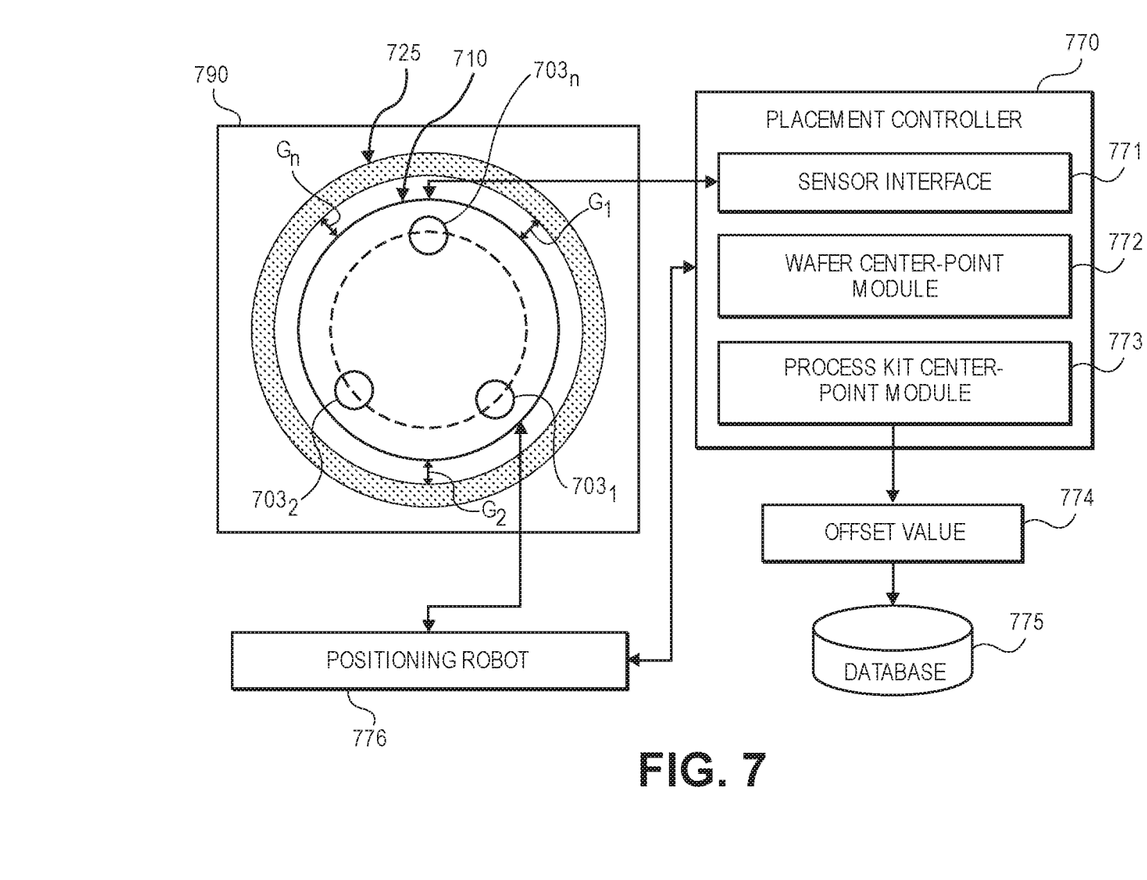
FIG. 7 is a schematic diagram of a processing tool and a placement controller for determining the offset of a process kit relative to the center of a support surface, in accordance with an embodiment.

Referring now to FIG. 7, a schematic block diagram of a processing tool 790 with the a placement controller 770 for implementing a process to measure the positioning of the process kit 725 is shown, in accordance with an embodiment. In an embodiment, the process kit 725 may be positioned in the processing tool 790 around a support surface 705. For example, the process kit 725 may be manually installed inside the processing tool 790.

In an embodiment, the placement controller 770 may provide instructions to a positioning robot 776 to place a sensor wafer 710 on the support surface 705 of the processing tool 790. The sensor wafer 710 may be a sensor wafer similar to sensor wafers described above. For example, the sensor wafer 710 may comprise a plurality of edge sensor regions for measuring gaps $G_1$-$G_n$ between the edge of the sensor wafer 710 and the edge of the process kit 725. The sensor wafer 710 may also comprise a plurality of bottom sensor regions to determine the edge locations $703_1$-$703_n$ of the support surface 705.

In an embodiment, the sensor information from the sensor wafer 710 may be obtained by the sensor interface 771 of the placement controller 770. For example, the sensor interface 771 may receive sensor information from the sensor wafer 710 (e.g., wirelessly with a wireless communication module). The placement controller 790 may utilize sensor information (e.g., edge locations $703_1$-$703_n$) in a wafer center-point module 772 to determine a center-point of the sensor wafer 710 relative to a center-point of the support surface 705. The placement controller 790 may utilize sensor information (e.g., gaps $G_1$-$G_n$) in a process kit center-point module 773 to determine a center-point of the sensor wafer 710 relative to a center-point of the process kit 725. The placement controller 770 may use the results from the wafer center-point module 772 and the process kit center-point module 773 to generate an offset value 774 that is delivered to a database 775. The offset value 774 may be a total offset of the process kit 725 with respect to the support surface 705. In an embodiment, the when the total offset value 774 exceeds a predetermined threshold, an alert may be generated that indicates that the positioning of the process kit 725 needs to be readjusted. For example, the predetermined threshold may be 200 microns or more, or 100 microns or more.

Figure 8:
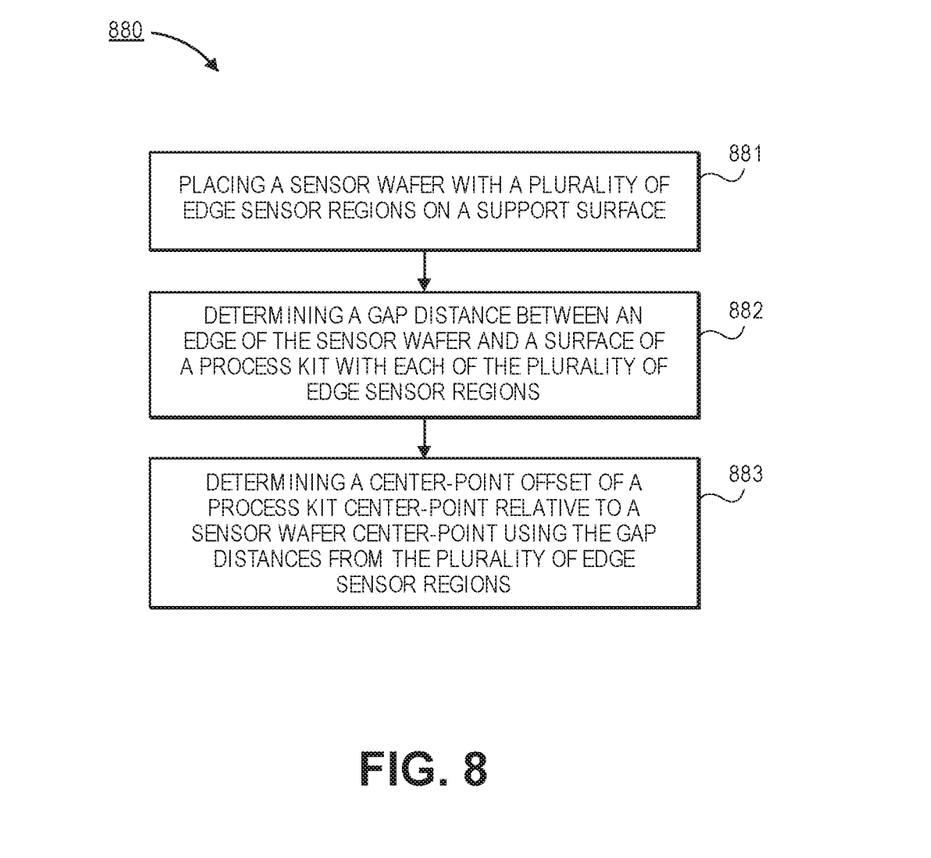
FIG. 8 is a flow diagram of a process for determining the offset of a process kit relative to a sensor wafer, in accordance with an embodiment.

Referring now to FIG. 8, a process flow diagram of a process 880 for determining the center-point of a process kit with a sensor wafer is shown, in accordance with an embodiment.

In an embodiment, operation 880 begins with operation 881 which comprises placing a sensor wafer with a plurality of edge sensor regions on a support surface. The sensor wafer may be any sensor wafer described in accordance with embodiments disclosed herein. In an embodiment, the sensor wafer may be placed on the support surface with a positioning robot controlled by a placement controller, similar to the embodiment described with respect to FIG. 7.

In an embodiment, operation 880 may continue with operation 882 which comprises determining a gap distance between an edge of the sensor wafer and a surface of a process kit with each of the plurality of edge sensor regions. For example, the edge sensor regions may comprise self-referencing capacitive sensors. The edge sensor regions may have electric field guards below them to modify the electric field of the capacitive sensors. Additional embodiments may include top surface recess proximate to the edge sensor regions to eliminate erroneous measurements of the top surface of the sensor wafer.

In an embodiment, operation 880 may continue with operation 883 which comprises determining a center-point offset of a process kit center-point relative to a sensor wafer center-point using the gap distances from the plurality of edge sensor regions. In an embodiment, the center-point offset may be determined by a positioning controller and stored in a database. When the center-point offset is greater than a predetermined threshold, the process kit may be repositioned in some embodiments.

Figure 9:
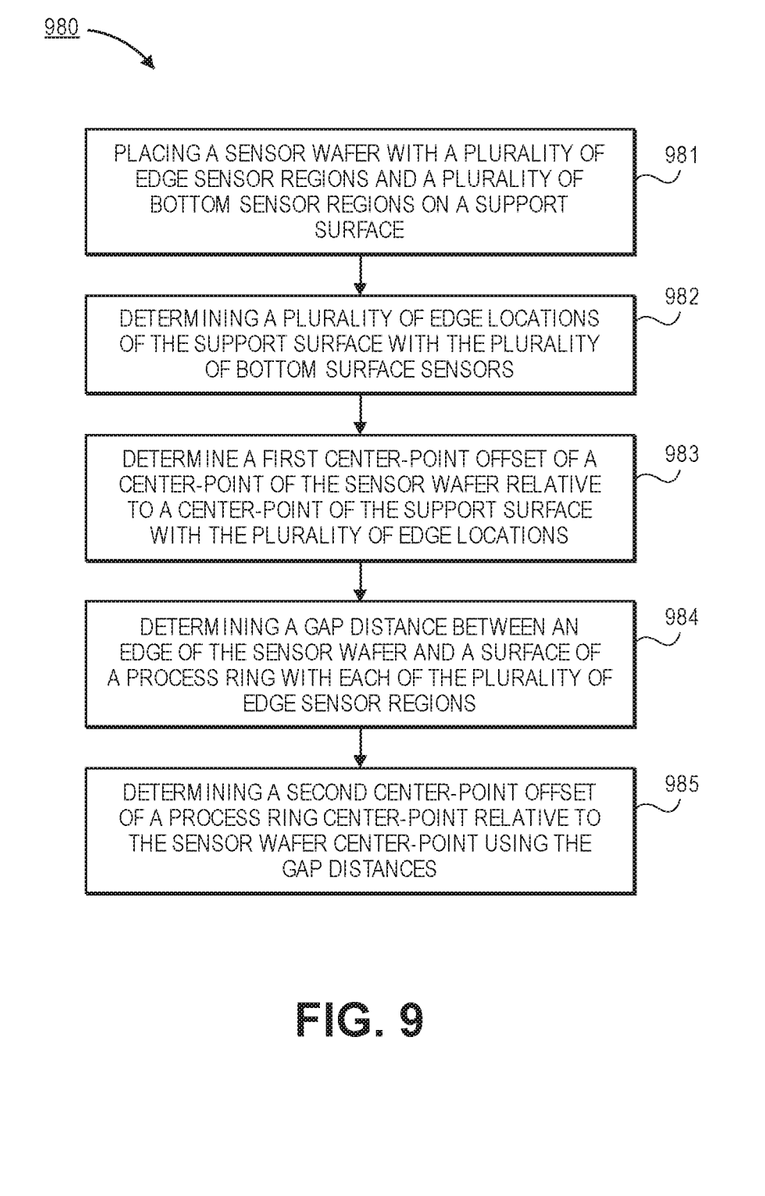
FIG. 9 is a flow diagram of a process for determining the offset of a process kit relative to a center of a support surface, in accordance with an embodiment.

Referring now to 9, a process flow diagram of a process 980 for determining the center-point of a process kit with a sensor wafer is shown, in accordance with an embodiment.

In an embodiment, process 980 begins with operation 981 which comprises placing a sensor wafer with a plurality of edge sensor regions and a plurality of bottom sensor regions on a support surface. The sensor wafer may be any sensor wafer described in accordance with embodiments disclosed herein. For example, the sensor wafer may be similar to the sensor wafer 610 illustrated in FIG. 6A.

In an embodiment, process 980 continues with operation 982 which comprises determining a plurality of edge location measurements of the support surface using the plurality of bottom sensor regions.

In an embodiment, operation 980 may continue with operation 983 which comprises determining a first center-point offset of a center of the sensor wafer relative to a center of the support surface using the plurality of edge location measurements.

In an embodiment, process 980 may continue with operation 984 which comprises determining a gap distance between an edge of the sensor wafer and a surface of the process kit with each of the plurality of edge sensor regions.

In an embodiment, process 980 may continue with operation 985 which comprises determining a second center-point offset of a process kit center-point relative to the sensor wafer center-point using the gap distances from the plurality of edge sensor regions.

Figure 10:
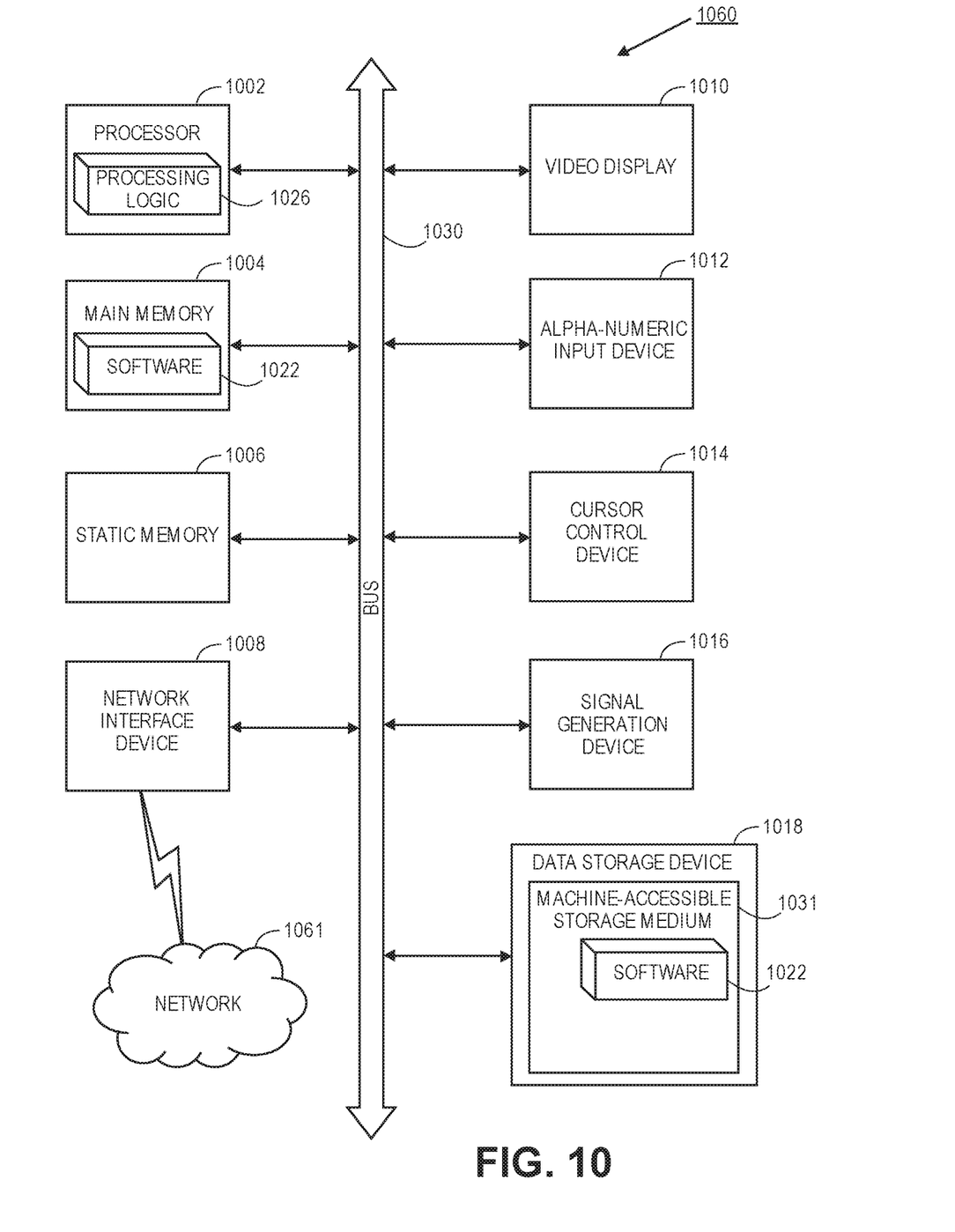
FIG. 10 illustrates a block diagram of an exemplary computer system that may be used in conjunction with processes that include determining the offset of a process kit relative to a center of a support surface, in accordance with an embodiment.

Referring now to FIG. 10, a block diagram of an exemplary computer system 1060 of a processing tool is illustrated in accordance with an embodiment. In an embodiment, the computer system 1060 may be used as the placement controller. In an embodiment, computer system 1060 is coupled to and controls processing in the processing tool. Computer system 1060 may be connected (e.g., networked) to other machines in a network 1061 (e.g., a Local Area Network (LAN), an intranet, an extranet, or the Internet). Computer system 1060 may operate in the capacity of a server or a client machine in a client-server network environment, or as a peer machine in a peer-to-peer (or distributed) network environment. Computer system 1060 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1060, the term "machine" shall also be taken to include any collection of machines (e.g., computers) that individually or jointly execute a set (or multiple sets) of instructions to perform any one or more of the methodologies described herein.

Computer system 1060 may include a computer program product, or software 1022, having a non-transitory machine-readable medium having stored thereon instructions, which may be used to program computer system 1060 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1060 includes a system processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

System processor 1002 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1002 may also be one or more special-purpose processing devices such as an application specific integrated circuit (ASIC), a field programmable gate array (FPGA), a digital signal system processor (DSP), network system processor, or the like. System processor 1002 is configured to execute the processing logic 1026 for performing the operations described herein.

The computer system 1060 may further include a system network interface device 1008 for communicating with other devices or machines. The computer system 1060 may also include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium 1031 (or more specifically a computer-readable storage medium) on which is stored one or more sets of instructions (e.g., software 1022) embodying any one or more of the methodologies or functions described herein. The software 1022 may also reside, completely or at least partially, within the main memory 1004 and/or within the system processor 1002 during execution thereof by the computer system 1060, the main memory 1004 and the system processor 1002 also constituting machine-readable storage media. The software 1022 may further be transmitted or received over a network 1061 via the system network interface device 1008.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A sensor wafer, comprising:
    a substrate, wherein the substrate comprises a first surface, a second surface opposite the first surface, and an edge surface between the first surface and the second surface;
    a plurality of sensor regions formed along the edge surface, wherein each sensor region comprises a self-referencing capacitive sensor; and
    a recess into the first surface of the substrate, wherein the recess extends to the edge surface.

2. The sensor wafer of claim 1, wherein the plurality of sensor regions comprises at least three sensor regions.

3. The sensor wafer of claim 1, wherein the self-referencing capacitive sensor comprises a first probe and a second probe, wherein an output phase of the first probe is 180 degrees offset from an output phase of the second probe.

4. The sensor wafer of claim 1, wherein the recess extends back from the sensor region at least 1.0 mm.

5. The sensor wafer of claim 1, further comprising:
    a plurality of second sensor regions on the second surface of the substrate.

6. The sensor wafer of claim 5, wherein the second sensor regions are recessed from the second surface.

7. The sensor wafer of claim 1, further comprising an electric field guard below each of the plurality of sensor regions.

8. The sensor wafer of claim 1, further comprising:
    a computing module, wherein the computing module is communicatively coupled to the plurality of sensor regions.

9. The sensor wafer of claim 8, wherein the computing module comprises one or more of a power source, a processor, a memory, and a wireless communications module.

10. The sensor wafer of claim 1, wherein the substrate has a diameter that is 300 mm.

11. A method of determining the position of a process kit in a chamber, comprising:
    placing a process kit into a chamber around a support surface;
    placing a sensor wafer onto the support surface, wherein the sensor wafer comprises a first surface that is supported by the support surface, a second surface opposite the first surface, and an edge surface connecting the first surface to the second surface, and wherein a plurality of sensor regions are formed on the edge surface;
    determining a gap distance between each of the plurality of sensor regions and a surface of the process kit;
    determining a center-point offset of a center-point of the process kit relative to a center-point of the sensor wafer from the gap distances; and
    adjusting a position of the process kit when the center-point offset exceeds a predesignated threshold.

12. The method of claim 11, wherein the plurality of sensor regions comprise self-referencing capacitive sensors.

13. The method of claim 12, wherein the self-referencing capacitive sensors comprise a first probe and a second probe, wherein an output phase of the first probe is 180 degrees offset from an output phase of the second probe.

14. The method of claim 11, further comprising:
    determining a second center-point offset, wherein the second center-point offset is the offset of the center-point of the sensor wafer relative to a center-point of the support surface.

15. The method of claim 14, wherein second sensor regions on the first surface of the sensor wafer are used to determine the second center-point offset.

16. The method of claim 15, further comprising:
    determining a total offset, wherein the total offset is determined by adding the first center-point offset to the second center-point offset.

17. A method of determining the position of a process kit in a chamber, comprising:
    placing a process kit into a chamber around a support surface;
    placing a sensor wafer onto the support surface, wherein the sensor wafer comprises a first surface that is supported by the support surface, a second surface opposite the first surface, and an edge surface connecting the first surface to the second surface, and wherein a first plurality of sensor regions are formed on the edge surface and a second plurality of sensor regions are formed on the first surface;
    determining a gap distance between each of the plurality of first sensor regions and a surface of the process kit;
    determining a first center-point offset from the gap distances, wherein the first center-point offset is an offset of a center-point of the process kit relative to a center-point of the sensor wafer;
    determining a plurality of edge locations of the support surface with the plurality of second sensor regions;
    determining a second center-point offset with the plurality of edge locations, wherein the second center-point offset is an offset of a center-point of the support surface relative to the center-point of the sensor wafer;

determining a total offset, wherein the total offset is determined by adding the first center-point offset to the second center-point offset; and adjusting the position of the process kit when the total offset exceeds a predesignated threshold.

18. The method of claim 17, wherein the first plurality of sensor regions comprise self-referencing capacitive sensors.

* * * * *

UNITED STATES PATENT AND TRADEMARK OFFICE
CERTIFICATE OF CORRECTION

PATENT NO. : 10,847,393 B2
APPLICATION NO. : 16/121183
DATED : November 24, 2020
INVENTOR(S) : Potter et al.

It is certified that error appears in the above-identified patent and that said Letters Patent is hereby corrected as shown below:

In the Specification

Column 2, Line 42, delete "censor" and insert -- sensor --

Column 3, Line 41, delete "125" and insert -- 105 --

Column 5, Line 66, delete "638" and insert -- 634 --

Column 7, Line 10, delete "operation" and insert -- process --

Column 7, Line 18, delete "operation" and insert -- process --

Column 7, Line 29, delete "operation" and insert -- process --

Column 7, Line 52, delete "operation" and insert -- process --

Signed and Sealed this
Fourth Day of May, 2021

Drew Hirshfeld
*Performing the Functions and Duties of the
Under Secretary of Commerce for Intellectual Property and
Director of the United States Patent and Trademark Office*